(12) United States Patent
Yoon et al.

(10) Patent No.: US 8,614,032 B2
(45) Date of Patent: Dec. 24, 2013

(54) LASER-REFLECTIVE MASK AND METHOD FOR MANUFACTURING SAME

(75) Inventors: Hyeong Ryeol Yoon, Suwon-si (KR); Nae Hwang Park, Suwon-si (KR); Su Chan Kim, Incheon (KR); Chan Koo Lee, Seongnam-si (KR); Yong Mun Kim, Pyeongtaek-si (KR)

(73) Assignee: WI-A Corporation, Suwon-si (KR)

( * ) Notice: Subject to any disclaimer, the term of this patent is extended or adjusted under 35 U.S.C. 154(b) by 135 days.

(21) Appl. No.: 13/147,583

(22) PCT Filed: Jul. 21, 2010

(86) PCT No.: PCT/KR2010/004772
§ 371 (c)(1),
(2), (4) Date: Aug. 2, 2011

(87) PCT Pub. No.: WO2011/027972
PCT Pub. Date: Mar. 10, 2011

(65) Prior Publication Data
US 2011/0287348 A1 Nov. 24, 2011

(30) Foreign Application Priority Data
Sep. 2, 2009 (KR) ........................ 10-2009-0082641

(51) Int. Cl.
*G03F 1/48* (2012.01)
*G03F 1/52* (2012.01)
*G03F 1/58* (2012.01)
*G03F 1/76* (2012.01)
*G03F 1/80* (2012.01)
*G02B 1/12* (2006.01)
*B29C 35/08* (2006.01)

(52) U.S. Cl.
USPC ............................. 430/5; 264/1.37; 264/400

(58) Field of Classification Search
USPC .............................................. 430/5
See application file for complete search history.

(56) References Cited

U.S. PATENT DOCUMENTS

| 5,935,733 A * | 8/1999 | Scott et al. ................... 430/5 |
| 5,985,491 A * | 11/1999 | Kim et al. .................... 430/5 |
| 6,379,985 B1 * | 4/2002 | Cervantes et al. ........... 438/33 |
| 2004/0096753 A1 * | 5/2004 | Jung ............................ 430/5 |
| 2006/0222961 A1 | 10/2006 | Yan |

FOREIGN PATENT DOCUMENTS

| JP | 2000-206671 A | 7/2000 |
| KR | 10-2008-0037801 | 5/2008 |
| KR | 10-0900902 | 5/2009 |

OTHER PUBLICATIONS

International Search Report mailed Feb. 14, 2011, issued in corresponding International Application No. PCT/KR2010/004772, filed Jul. 21, 2010.

* cited by examiner

*Primary Examiner* — Mark F Huff
*Assistant Examiner* — John S Ruggles
(74) *Attorney, Agent, or Firm* — Christensen O'Connor Johnson Kindness LLP (57) ABSTRACT

In a laser reflective mask and a fabricating method thereof, reflective layers with different reflectances are sequentially and repeatedly laminated on top of a base substrate which has a reflective layer filling groove having a predetermined depth in a reflection region for a laser beam and then the remaining reflective layer laminated on the other region except for the portion filled in the reflective layer filling groove are removed through a chemical mechanical polishing (CMP) process, or a lift-off process using irradiation with the laser beam or an etchant, so that a reflective layer pattern configured to be filled in the reflective layer filling groove may be formed, thereby capable of not only facilitating a fabricating process of the laser reflective mask but also forming a more precise reflective layer pattern.

6 Claims, 6 Drawing Sheets

LASER-REFLECTIVE MASK AND METHOD FOR MANUFACTURING SAME

BACKGROUND OF THE INVENTION

1. Field of the Invention

The present invention relates to a laser reflective mask and a fabrication method thereof. More particularly, the present invention relates to a laser reflective mask and a fabrication method thereof, in which reflective layers having different reflectances are sequentially and repeatedly laminated on top of a base substrate which has a reflective layer filling groove having a predetermined depth formed in a reflection region for a laser beam and then the remaining reflective layers laminated on the other regions except for the portion filled in the reflective layer filling groove are removed through a chemical mechanical polishing (CMP) process or a lift-off process using irradiation with the laser beam or an etchant, so that a reflective layer pattern configured to be filled in the reflective layer filling groove may be formed, thereby capable of not only facilitating a fabricating process of the laser reflective mask, but also forming a more precise pattern.

2. Description of the Related Art

Thin film technology refers to a film processing technique ranging from an atomic monolayer to a layer having a thickness of several micrometers (μm), and is used for electrode interconnection of an integrated circuit (IC), insulation between wires, fabrication of resistors, and the like. As a technology obtained by synthesizing the fabrication and application of thin films, the thin film technology has been widely used in industries of a semiconductor, a liquid crystal display (LCD), a solar cell, a light emitting diode (LED), and the like.

Products produced using the thin film technology are configured as various devices, and each of the devices is configured to have a structure necessary for its function by sequentially laminating several thin films.

The thin films are formed through a vacuum deposition, a sputtering, a thermal oxidation, or the like. Each of the thin films may be formed to have various structures through a patterning process.

The patterning process is generally performed by coating a photoresist on top of a substrate on which a layer to be etched is formed, performing an exposing process by irradiation with ultraviolet light through a mask having a desired pattern formed therein, forming a photoresist pattern through a developing process, forming a pattern of the layer to be etched by etching the layer to be etched using the photoresist pattern as an etching mask, and then removing the photoresist pattern.

Since the patterning process is very complicated, a long processing time is required to perform the patterning process. Since a high-priced photoresist is used in the patterning process, the processing cost increases. Since a multi-step process is performed, there occur various problems such as the existence of a potential defect factor and the reduction of productivity. Since various high-priced equipments are required to perform the multi-step process, the manufacturing cost increases. Since a large amount of chemical material is used in the patterning process, it contaminates the environment.

Meanwhile, a laser direct patterning (hereinafter, referred to as LDP) capable of patterning a thin film using a laser and an optical device has recently applied in various fields. The LDP has a patterning process simpler than the existing patterning process, and is low-priced and environmentally harmless.

The LDP is performed using a method of removing an unnecessary portion from a layer to be etched by irradiating the layer to be etched with a laser beam. In this case, the diameter of the laser beam is very small, and therefore, it takes much processing time to entirely pattern the layer to be etched, which is formed on a substrate.

To solve such a problem, a method is used, in which a mask having a desired pattern formed therein is disposed above the layer to be etched and the layer to be etched is patterned while a surface of the mask is scanned to be irradiated with the laser beam, thereby improving processing efficiency.

However, the mask used in such a process is generally formed by forming a shielding layer made of Cr or the like, which absorbs the laser beam, on top of a base substrate through which the laser beam may be transmitted and patterning the shielding layer through a patterning process using a photoresist. If the layer to be etched is etched by positioning the mask closely to the substrate, the mask is damaged due to the energy of the laser beam for etching the layer to be etched. Therefore, the layer to be etched is etched by interposing a projection lens for focusing the laser beam between the substrate and the mask, irradiating the mask with a laser beam having a slightly lower energy than that of the laser beam for etching the layer to be etched, and focusing the energy through the projection lens.

Therefore, the configuration of a patterning system is complicated due to the configuration of the mask described above, and the layer to be etched on the substrate is necessarily etched while moving an optical system which includes the substrate or the laser beam. Hence, it is difficult to implement a pattern having a desired shape due to the occurrence of an error according to the movement, and accordingly, there is a problem in that the productivity may be deteriorated.

To solve such a problem, U.S. Pat. No. 4,923,722 has disclosed a reflective mask that reflects a laser beam which is generated by repeatedly laminating a dielectric material having a relatively lower reflectance for the laser beam and a dielectric material having a relatively higher reflectance for the laser beam and collectively patterning the laminated dielectric materials using a photoresist.

Figure 1:
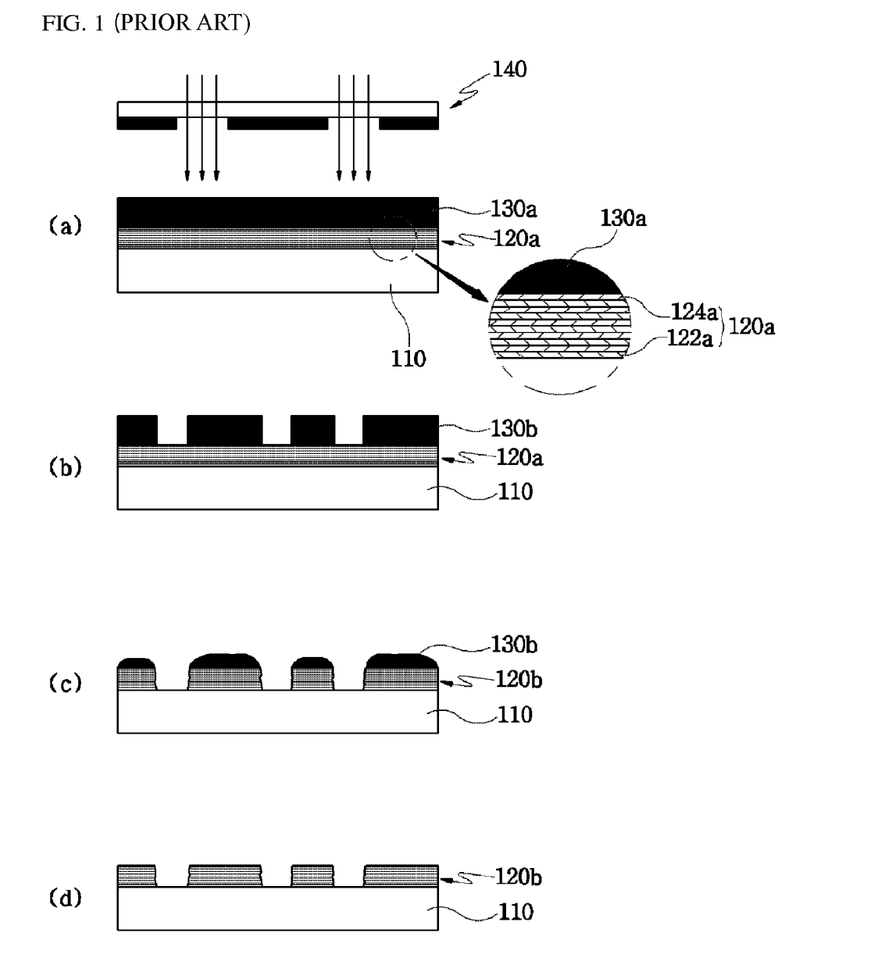
FIG. 1 is a sectional view sequentially illustrating fabricating processes of a laser reflective mask according to a related art.

FIG. 1 is a sectional view sequentially illustrating fabricating processes of a laser reflective mask according to a related art.

Referring to FIG. 1, a first reflective layer 122a having a lower reflectance and a second reflective layer 124a having a reflectance higher than that of the first reflective layer 122a are sequentially and repeatedly laminated on top of a substrate 110, through which a laser beam may be transmitted, to form a reflective layer 120a; a photoresist 130a is coated on top of the reflective layer 120a; and then the photoresist is irradiated with ultraviolet light using a mask 140 having a desired pattern formed therein (step a). Sequentially, the photoresist 130a is developed to form a photoresist pattern 130b (step b), and then the reflective layer 120a is etched using the photoresist pattern 130b as an etching mask to form a reflective layer pattern 120b (step c). Then, the photoresist pattern 130b is removed (step d), thereby forming the laser reflective mask.

However, in the fabricating processes described above, it is difficult to detect an etching end point due to the difference in etching rate between the first and second reflective layers 122a and 124a laminated on the substrate 110, so that it is difficult to control a pattern profile. Since the entire photoresist pattern 130b used as the etching mask is removed or separated while the reflective layer 120a is etched, the accuracy of the finally implemented reflective layer pattern 120b is degraded. Therefore, if the reflective layer pattern 120b is used as an etching mask, there is a problem in that it is difficult to etch a layer to be etched as a desired pattern shape.

To solve such a problem, a method has been used in which a hard mask using a metallic material such as gold is interposed between the reflective layer and the photoresist. However, since the hard mask has a poor adhesion with the reflective layer, the reflective layer may be separated while the reflective layer is etched. Therefore, there is a problem in that the accuracy of the patterns has been still degraded.

SUMMARY OF THE INVENTION

An object of the present invention is to provide a laser reflective mask and a fabricating method thereof, in which a reflective layer pattern configured to be filled in a reflective layer filling groove is formed by forming a sacrificial layer having a predetermined thickness on top of a base substrate that constitutes the laser reflective mask; forming the reflective layer filling groove at a portion prearranged as a reflection region for a laser beam in the base substrate; sequentially and repeatedly laminating reflective layers having different reflectances; and then removing not only the remaining reflective layers laminated on the other regions except for the portion filled in the reflective layer filling groove, but also the sacrificial layer by a complete polishing of the reflective layers and the sacrificial layer using the base substrate as a polishing end point or irradiation with the laser beam through a rear surface of the base substrate or an etchant, so that a plurality of reflective layers having different etching ratios can be effectively patterned, thereby improving the accuracy of the pattern.

According to an aspect of the present invention, there is provided a laser reflective mask, which includes a base substrate having a reflective layer filling groove having a predetermined depth formed in a reflection region for a laser beam; and a reflective layer pattern filled in the reflective layer filling groove, wherein the reflective layer pattern is configured by alternately and repeatedly laminating a first reflective layer formed of a $SiO_2$ layer and a second reflective layer having a reflectance higher than that of the first reflective layer.

According to another aspect of the present invention, there is provided a fabricating method of a laser reflective mask, which includes the steps of forming a sacrificial layer on top of a base substrate; etching an opening through the sacrificial layer and recessing the base substrate through an etching process for a region prearranged as a reflection region for a laser beam in the base substrate to form a sacrificial layer pattern and a reflective layer filling groove having a predetermined depth; alternately and repeatedly laminating first and second reflective layers having different reflectances on top of the base substrate, the sacrificial layer pattern and the reflective layer filling groove being formed on the base substrate until the reflective layer filling groove is completely filled; removing the sacrificial layer pattern and the first and second reflective layers laminated on top of the sacrificial layer pattern by a laser lift-off process of irradiating the base substrate with the laser beam from a bottom surface of the base substrate to form a reflective layer pattern configured in the reflective layer filling groove; and removing the sacrificial layer pattern remaining on top of the base substrate.

According to still another aspect of the present invention, there is provided a fabricating method of a laser reflective mask, which includes the steps of forming a sacrificial layer on top of a base substrate; etching an opening through the sacrificial layer and recessing the base substrate through an etching process for a region prearranged as a reflection region for a laser beam in the base substrate to form a sacrificial layer pattern and a reflective layer filling groove having a predetermined depth; alternately and repeatedly laminating first and second reflective layers having different reflectances on top of the base substrate, the sacrificial layer pattern and the reflective layer filling groove being formed on the base substrate; removing the first and second reflective layers laminated on top of the sacrificial layer pattern by a chemical lift-off process of removing the sacrificial layer pattern using an etching process to form a reflective layer pattern configured in the reflective layer filling groove; and removing the sacrificial layer pattern remaining on top of the base substrate.

BRIEF DESCRIPTION OF THE DRAWINGS

Preferred embodiments of the present invention can be understood in more detail from the following description taken in conjunction with the accompanying drawings, in which.

DETAILED DESCRIPTION OF THE INVENTION

Hereinafter, preferred embodiments of the present invention will be described in detail with reference to the accompanying drawings. The following embodiments are provided only for illustrative purposes so that those skilled in the art can fully understand the spirit of the present invention. Therefore, the present invention is not limited to the following embodiments but may be implemented in other forms. In the drawings, the widths, lengths, thicknesses and the like of elements are exaggerated for convenience of illustration. Like reference numerals indicate like elements throughout the specification and drawings.

Figure 2:
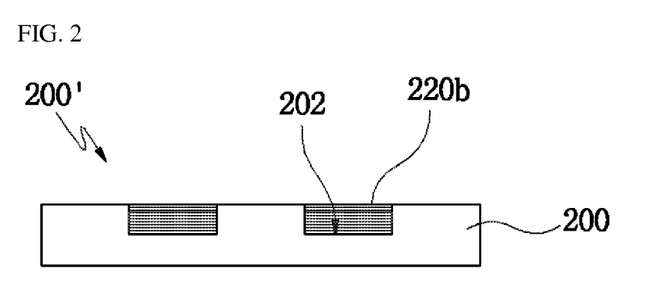
FIG. 2 is a sectional view showing a configuration of a laser reflective mask according to the present invention.

FIG. 2 is a sectional view showing a configuration of a laser reflective mask according to the present invention.

Referring to FIG. 2, the laser reflective mask 200' according to the present invention is configured to include a base substrate 200 which has a reflective layer filling groove 202 having a predetermined depth formed in a reflection region for a laser beam, and a reflective layer pattern 220b filled in the reflective layer filling groove 202 of the base substrate 200.

The base substrate 200 is made of a material through which the laser beam may be transmitted, and a glass substrate, a fused silica substrate, a quartz substrate, a synthetic quartz substrate, a $CaF_2$ substrate or the like is used as the base substrate 200. An anti-reflective coating (ARC) may be additionally formed on a bottom surface of the base substrate 200, i.e., a surface onto which the laser beam is incident. As a result, the ARC may cause the transmittance of the laser beam through a transmission region of the base substrate 200 to be improved, thereby increasing the etching efficiency.

The reflective layer pattern 220b is formed of an organic layer for reflecting the laser beam. The reflective layer pattern is configured by alternately and repeatedly laminating a first reflective layer having a lower reflectance and a second reflective layer having a reflectance higher than that of the first reflective layer.

A $SiO_2$ layer having a lower reflectance may be used as the first reflective layer, while a $MgF_2$ layer, a $TiO_2$ layer, an $Al_2O_3$ layer, a $Ta_2O_5$ layer, a cerium fluoride layer, a zinc sulfide layer, an $AlF_3$ layer, a halfnium oxide layer, a zirconium oxide layer or the like, whose reflectance is higher than that of the first reflective layer, may be used as the second reflective layer. For example, the reflective layer pattern 220b may be formed by repeatedly laminating several layers to dozens of layers each having a laminated structure such as $MgF_2$ layer/$SiO_2$ layer or $Ta_2O_5$ layer/$SiO_2$ layer. The reflective layer pattern of $MgF_2$ layer/$SiO_2$ layer is configured to be capable of enduring a laser beam having energy of 5 to 8 $J/cm^2$ while the reflective layer pattern of $Ta_2O_5$ layer/$SiO_2$ layer is configured to be capable of enduring a laser beam having an energy of 10 $J/cm^2$ or so.

The reflective layer pattern 220b may be configured by selecting the kind of the reflective layer to be used depending on the wavelength of the laser beam for etching a layer to be etched. The reflective layer pattern 220b is configured to have a reflectance ranging from 90 to 100% against the laser beam so as to reflect most of the laser beam, so that the damage of the reflective layer pattern due to the laser beam having a higher energy may be minimized.

Through such a configuration, a patterning process can be performed by positioning the laser reflective mask closely to the substrate on which a layer to be etched is formed and irradiating the layer with the laser beam having such a high energy to etch the layer. Hence, a projection lens for focusing the laser beam need not be used, so that the configuration of a patterning system can be simplified. As a result, the laser reflective mask can be configured to have the same size as the substrate on which the layer to be etched is formed, thereby preventing an error which might be generated by the movement of the substrate or the laser reflective mask.

The reflective layer pattern 220b may be configured to reflect a laser beam of multiple wavelengths. In this case, by selecting the second reflective layer depending on the wavelength of the laser beam to be used and changing both the inter-layer thickness between the first and second reflective layers and the entire thickness of the reflective layer pattern 220b, the reflective layer pattern 220b may be configured to simultaneously reflect a laser beam of multiple wavelengths, e.g., a laser beam having an ultraviolet wavelength of 523 nm and an infrared wavelength of 1064 nm, without changing the laser reflective mask, thereby preventing an error which might be generated by the replacement of the laser reflective mask.

Meanwhile, a protection layer (not shown) may be additionally formed on top of the base substrate 200 and the reflective layer pattern 220b. The protection layer is configured to prevent the base substrate 200 and the reflective layer pattern 220b in the laser reflective mask from being damaged by an etchant which is introduced between the laser reflective mask and the layer to be etched so as to facilitate the patterning during the patterning of the layer to be etched using the laser reflective mask according to the present invention as described above, thereby improving the durability of the laser reflective mask. A diamond like carbon (DLC) layer having an excellent chemical resistance against an etchant may be used as the protection layer.

The laser reflective mask according to the present invention, configured as described above, is manufactured using the method as described below.

Figure 3:
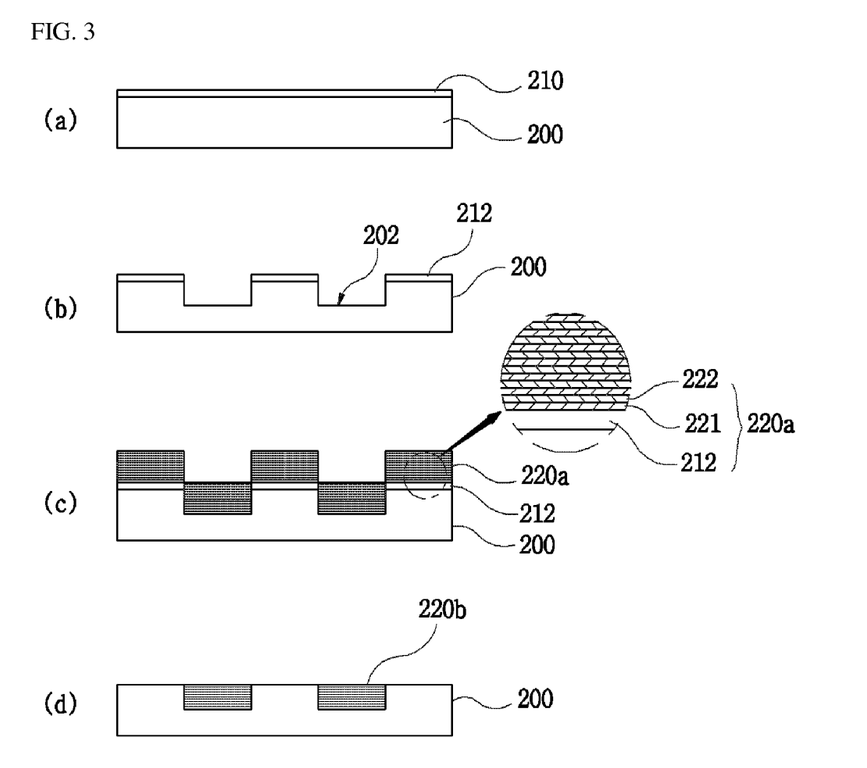
FIG. 3 is a sectional view sequentially illustrating fabricating processes of a laser reflective mask according to a first embodiment of the present invention.

FIG. 3 is a sectional view sequentially illustrating fabricating processes of a laser reflective mask according to a first embodiment of the present invention.

First, a sacrificial layer 210 is formed on top of a base substrate 200 (step a). At this time, a glass substrate, a fused silica substrate, a quartz substrate, a synthetic quartz substrate, a $CaF_2$ substrate or the like, through which a laser beam may be transmitted, may be used as the base substrate 200. The sacrificial layer 210 may be formed of a metal layer of one metallic material selected from the group consisting of chrome (Cr), molybdenum (Mo), aluminum (Al), copper (Cu), gold (Au) and the like, or a laminated structure of at least two different metal layers of at least two different metallic materials selected from the group of Cr, Mo, Al, Cu, Au and the like.

An anti-reflective coating (ARC, not shown) may be additionally formed on a bottom surface of the base substrate 200, i.e., a surface onto which the laser beam is incident. As a result, such a configuration may cause the transmittance of the laser beam through a transmission region of the base substrate 200 to be improved, thereby increasing the etching efficiency.

Next, an opening is etched through the sacrificial layer 210 and the base substrate 200 is recessed by an etching process for a region prearranged as a reflection region for the laser beam in the base substrate 200, so that a sacrificial layer pattern 212 may be formed and a reflective layer filling groove 202 having a predetermined depth in the prearranged reflection region for the laser beam may be also simultaneously formed (step b). At this time, the reflective layer filling groove 202 may be formed through a photoresist patterning process or a patterning process using laser. When the reflective layer filling groove 202 is formed by the photoresist patterning process, a photoresist pattern (not shown) is formed on top of the sacrificial layer 210, and the sacrificial layer 210 is etched to form the sacrificial layer pattern 212 for exposing the prearranged reflection region for the laser beam. Then, the base substrate 200 is etched using the photoresist pattern and the sacrificial layer pattern 212 as an etching mask, thereby forming the reflective layer filling groove. In this case, the sacrificial layer pattern 212 is used as a hard mask for forming the reflective layer filling groove 202.

Subsequently, a reflective layer 220a for reflecting the laser beam is formed on top of the base substrate 200 on which the sacrificial layer pattern 212 and the reflective layer filling groove 202 are formed. The reflective layer 220a is formed by alternately and repeatedly laminating several layers to dozens of layers, each having a first reflective layer 221 and a second reflective layer 222 having a reflectance higher than that of the first reflective layer 221, until the reflective layer filling groove 202 is completely filled (step c). At this time, a $SiO_2$ layer having a relatively lower reflectance with respect to the laser beam may be used as the first reflective layer 221, while a $MgF_2$ layer, a $TiO_2$ layer, an $Al_2O_3$ layer, a $Ta_2O_5$ layer, a cerium fluoride layer, a zinc sulfide layer, an $AlF_3$ layer, a halfnium oxide layer, a zirconium oxide layer or the like, whose reflectance is higher than that of the first reflective layer 221, may be used as the second reflective layer 222. Each of the first and second reflective layers may be formed by a method such as evaporation deposition, ion beam assisted deposition, chemical vapor deposition (CVD), ion beam deposition, molecular beam epitaxy (MBE), sputter deposition or the like.

Thereafter, the sacrificial layer pattern 212 and the reflective layer 220a laminated on top of the sacrificial layer pattern 212 are polished through a chemical mechanical polishing (CMP) process in which a top surface of the base substrate 200 is used as a polishing end point while a slurry-containing polishing solution is supplied to a surface of the laminated reflective layer 220a (step d).

After the reflective layer pattern 220b filled in the reflective layer filling groove 202 is formed as described above, a wet etching process is performed to remove the sacrificial layer pattern 212 which might remain on the base substrate 200. This is because a portion at which the sacrificial layer pattern 212 is not removed may exist due to the polishing discrepancy in the CMP process so that such a wet etching process is performed to completely remove the sacrificial layer pattern 212 which might remain on the base substrate 200, thereby capable of fundamentally eliminating a defect which may be generated by the sacrificial layer pattern 212 in a subsequent laser patterning process using the laser reflective mask.

Subsequently, a protection layer (not shown) having a predetermined thickness is formed on top of the base substrate 200 and the reflective layer pattern 220b, so that the base substrate 200 or reflective layer pattern 220b of the laser reflective mask may be prevented from being damaged by an etchant which is introduced between the laser reflective mask and the layer to be etched during the pattering of the layer to be etched using the laser reflective mask of the present invention.

Figure 4:
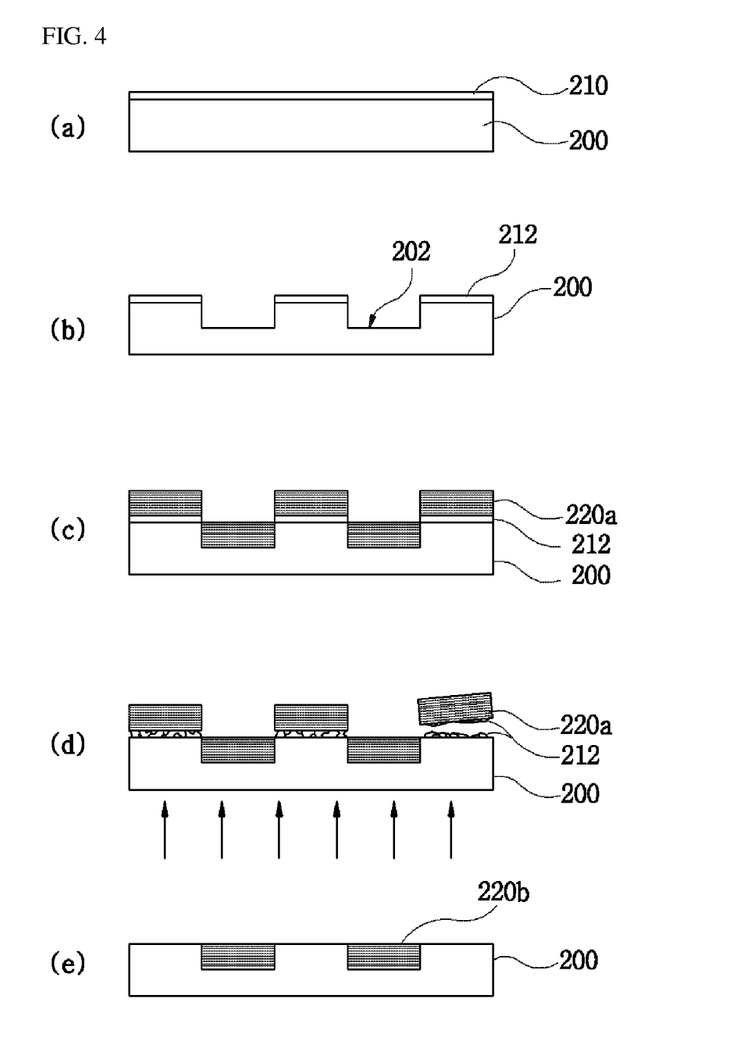
FIG. 4 is a sectional view sequentially illustrating fabricating processes of a laser reflective mask according to a second embodiment of the present invention.

FIG. 4 is a sectional view sequentially illustrating fabricating processes of a laser reflective mask according to a second embodiment of the present invention.

Referring to FIG. 4, a fabricating method of a laser reflective mask according to the second embodiment of the present invention is performed using the same method as described in the first embodiment, except for a process of removing the sacrificial layer pattern 212 formed on top of the base substrate 200 and the reflective layer 220a laminated on top of the sacrificial layer pattern 212 by a lift-off process using a laser beam instead of the CMP process.

That is, the reflective layer 220a is laminated on top of the base substrate 200 on which the sacrificial layer pattern 212 and the reflective layer filling groove 202 are formed, and then the base substrate 200 is irradiated with the laser beam from a bottom surface of the base substrate 200, so that the sacrificial layer pattern 212 and the reflective layer 220a formed on a region except for the reflective layer filling groove 202, i.e., a non-reflection region for the laser beam, may be lifted off to form the reflective layer pattern 220b filled in the reflective layer filling groove 202 (steps d and e).

If the base substrate 200 is irradiated with the laser beam from the bottom surface of the base substrate 200 as described above, almost all of the laser beam is reflected from the reflective layer pattern 220b formed in the reflective layer filling groove 202, but the laser beam is not reflected from the sacrificial layer pattern 212 formed on the region except for the reflective layer filling groove 202, so that the sacrificial layer pattern 212 is overheated by the energy of the laser beam absorbed therein.

At this time, chrome or molybdenum that constitutes the sacrificial layer pattern 212 is brittle when it is overheated. Accordingly, the sacrificial layer pattern is overheated by the laser beam, so that the sacrificial layer pattern is broken to pieces. As a result, the sacrificial layer pattern 212 together with the reflective layer 220a laminated on top of the sacrificial layer pattern 212 are both separated from the base substrate 200.

If the sacrificial layer pattern 212 is formed of a material with a relatively higher hardness, the sacrificial layer pattern 212 may be more easily separated from the base substrate 200. On the other hand, if the sacrificial layer pattern is formed of a material with a relatively lower hardness, residues may be fused on the base substrate 200 even though the sacrificial layer pattern 212 is lifted off by the laser beam. Therefore, there is a problem in that it is difficult to remove the sacrificial layer pattern 212 even through a subsequent wet etching process.

Thus, when the sacrificial layer 210 is formed into a single-layered structure, it is preferably formed of a material with a higher hardness, such as chrome or molybdenum. When the sacrificial layer 210 is formed of a laminated structure having multiple layers therein, the lowermost layer that comes in direct contact with the top surface of the base substrate 200 is preferably formed of chrome or molybdenum which has a relatively higher hardness, while aluminum, copper, gold, or the like, which has a relatively lower hardness, may be preferably laminated on top of the lowermost layer.

As described above, in the fabricating method of the laser reflective mask according to the first and second embodiments of the present, the reflective layer pattern 220b is formed through a process of chemically or mechanically polishing a top surface of the base substrate 200 or a process of irradiating the base substrate 200 with the laser beam through the bottom surface of the base substrate 200 in a beam-scanning manner. Thus, the fabricating method is suitable for forming the reflective layer pattern over a relatively wider area for a fast time.

Figure 5:
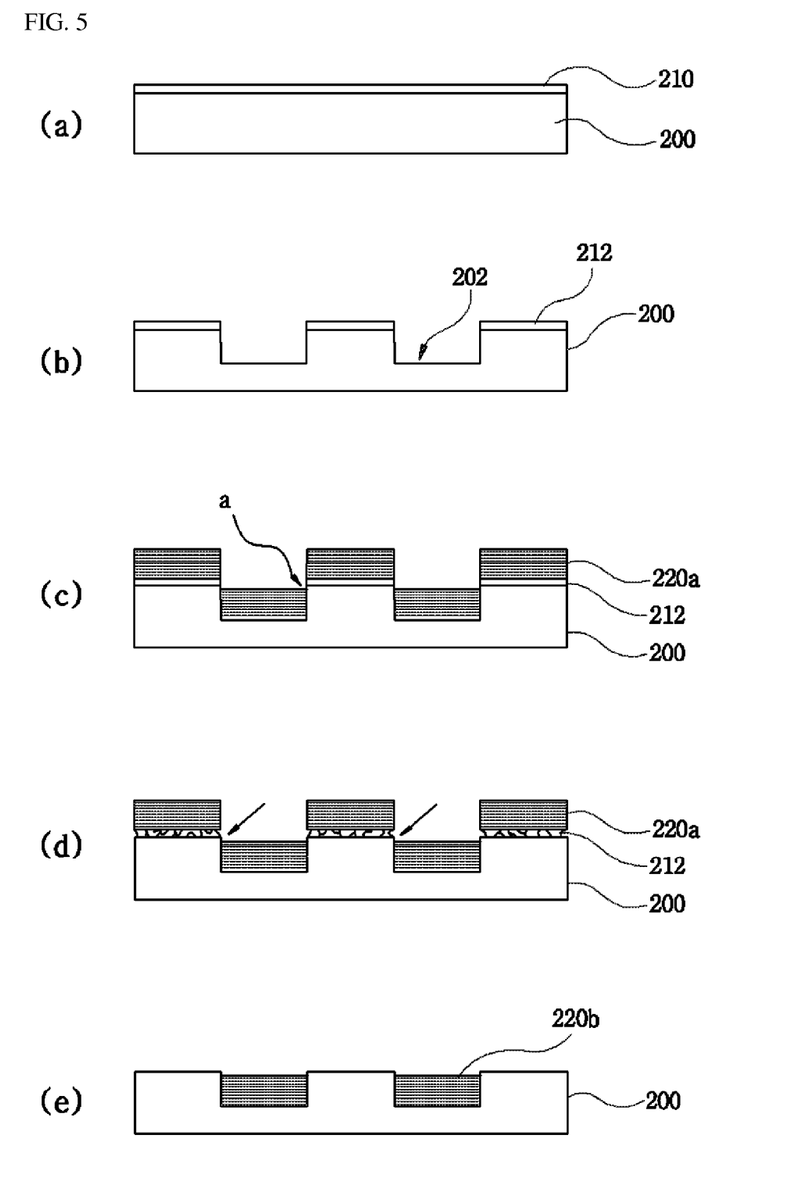
FIG. 5 is a sectional view sequentially illustrating fabricating processes of a laser reflective mask according to a third embodiment of the present invention.

FIG. 5 is a sectional view sequentially illustrating fabricating processes of a laser reflective mask according to a third embodiment of the present invention.

A fabricating method of the laser reflective mask according to the third embodiment of the present invention is a method in which the sacrificial layer pattern 212 formed on top of the base substrate 200 and the reflective layer 220a laminated on top of the sacrificial layer pattern 212 are removed by a chemical lift-off process using an etchant instead of the lift-off process using the laser beam. The fabricating method is frequently applied to form a reflective layer pattern having a fine line/space shape.

Referring to FIG. 5, in the third embodiment of the present invention, the sacrificial layer 210 is formed on top of the base substrate 200 (step a). An opening is etched through the sacrificial layer 210 and the base substrate 200 is recessed by an etching process for a region prearranged as a reflection region for the laser beam in the base substrate 200, so that the sacrificial layer pattern 212 is formed and the reflective layer filling groove 202 having a predetermined depth is simultaneously formed in the prearranged reflection region for the laser beam (step b). At this time, the reflective layer filling groove 202 is configured to be deeper by a predetermined thickness than the thickness of the reflective layer pattern to be formed. This is because, through the process of laminating and forming the reflective layer 220a in the reflective layer filling layer 202 as a subsequent process, the reflective layer 220a is laminated to form a predetermined step difference 'a' between the height of a top surface of the reflective layer 220a formed in the reflective layer filling groove 202 and the height of a top surface of the base substrate 200 as shown in (c) of FIG. 5, so that the etchant can be easily penetrated into the sacrificial layer pattern 212 through an interface between the sacrificial layer pattern 212 and the base substrate 200 in a subsequent chemical lift-off process for removing the sacrificial layer pattern 212.

Next, the reflective layer 220a is laminated on top of the base substrate 200 on which the sacrificial layer pattern 212 and the reflective layer filling groove 202 are formed (step c). At this time, the reflective layer 220a is formed to have a predetermined step difference 'a' with the base substrate 200 in the reflective layer filling groove 202 as described above, so that the interface between the base substrate 200 and the sacrificial layer pattern 212 may be exposed. The step difference 'a' formed between the reflective layer 220a and the base substrate 200 allows the etchant to be smoothly penetrated into the sacrificial layer pattern through the interface between the sacrificial layer pattern 212 and the base substrate 200 in the subsequent chemical lift-off process. However, if the step difference 'a' is extremely large, a defect may be generated due to the diffraction of the laser beam around a portion having the step difference 'a' in the laser etching process using the completed laser reflective mask, and accordingly, the step difference is necessarily formed to have an appropriate height. Preferably, the height of the step difference is set within the range from 0.5 to 2 μm.

Thereafter, the sacrificial layer pattern 212 and the reflective layer 220a, formed on the region except for the reflective layer filling groove 202, i.e., the non-reflection region for the laser beam, are chemically lifted off by immersing the base substrate 200 having the reflective layer 200a laminated thereon in a bath containing the etchant or by spraying the etchant on top of the base substrate 200 at a high pressure (step d), so that the reflective layer pattern 220b configured to be filled in the reflective layer filling groove 202 may be formed (step e).

If the base substrate 200 is immersed in the bath containing the etchant or the etchant is sprayed on top of the base substrate 200 at the high pressure, the sacrificial layer pattern 212 is removed, or the adhesion in the interface between the sacrificial layer pattern 212 and the base substrate 200 and/or the reflective layer 220a is lowered while the etchant is penetrated along a side surface of the sacrificial layer pattern 212, an interface between the base substrate 200 and the sacrificial layer pattern 212 and an interface between the sacrificial layer pattern 212 and the reflective layer 220a. Accordingly, the reflective layer 220a formed on the non-reflection region for the laser beam on the base substrate 200 is separated from the base substrate 200, and the reflective layer pattern 220b is formed in the reflection region for the laser beam, i.e., the reflective layer filling groove 202.

At this time, the used etchant is changed depending on the kind of the sacrificial layer pattern 212 formed on the base substrate 200. Preferably, the concentration of the etchant is properly controlled so as to minimize the damage of the reflective layer 220a filled in the reflective layer filling groove 202. As described above, the fabricating method of the laser reflective mask according to this embodiment is frequently applied to the laser reflective mask having the sacrificial layer pattern 212 formed in a fine line/space shape. Thus, even though an etchant having a relatively lower concentration is used, the sacrificial layer pattern 212 can be effectively removed.

Next, after the reflective layer pattern 220b is formed, the sacrificial layer pattern 212 which might remain on the base substrate 200 is completely removed through a cleaning process, so that it is possible to fundamentally eliminate a defect which may be generated by the sacrificial layer pattern 212 which might remain on the base substrate 200 in a subsequent laser patterning process using the completed laser reflective mask.

Figure 6:
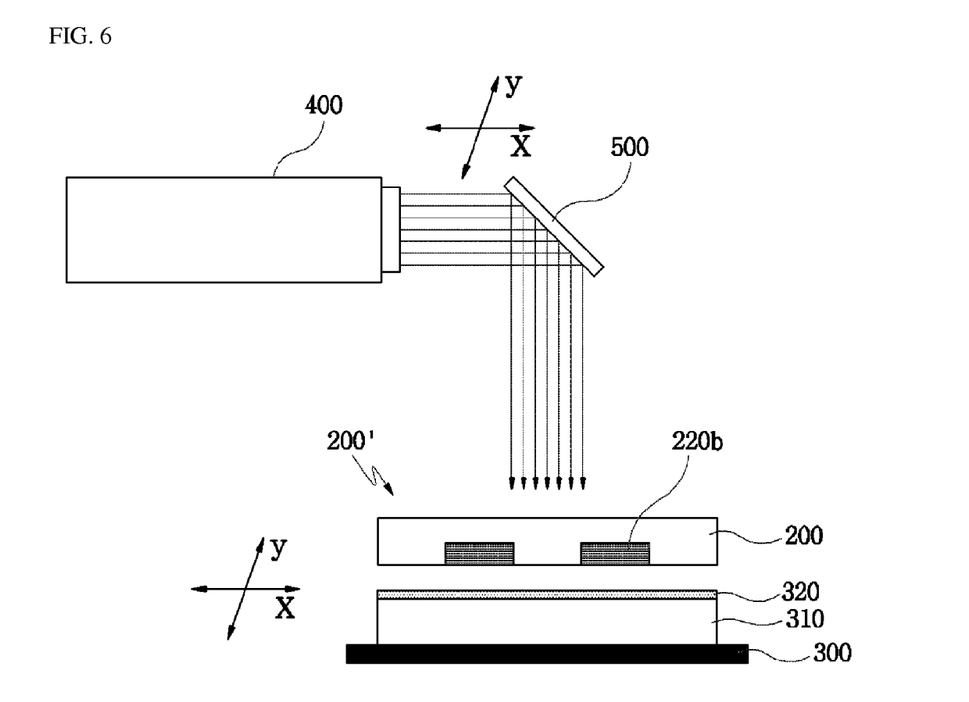
FIG. 6 is a view showing a state in which the laser reflective mask according to the present invention is applied to a laser patterning system.

FIG. 6 is a view showing a state in which the laser reflective mask according to the present invention is applied to a laser patterning system.

Referring to FIG. 6, the laser patterning system is configured to include a stage 300 having a substrate 310 mounted thereon, a laser oscillator 400 positioned at an upper side of the stage 300 so as to generates a laser beam having a predetermined wavelength, and a reflection mirror 500 for reflecting the laser beam generated from the laser oscillator 400 toward the stage 300. The substrate 310 on which a layer 320 to be etched is formed as well as a laser reflective mask 200' having a reflective layer pattern 220b formed therein are mounted in the laser patterning system.

The laser reflective mask 200' according to the present invention is disposed adjacent to the substrate 310 on which the layer 320 to be etched is formed. When the layer 320 to be etched is irradiated with a laser beam, in order to pattern the layer 320, the laser oscillator 400, the reflection mirror 500 and the laser reflective mask 200' may be moved in synchronization with one another or only the substrate 310 may be moved. The layer 320 to be etched is patterned as an etchant is introduced between the reflective mask 200' and the substrate 310, so that the layer 320 to be etched can be more easily patterned.

Meanwhile, if the reflective mask 200' is configured to have the same size as the substrate 310, in order to pattern the layer 320 to be etched, the reflective mask 200' may be fixedly aligned with the substrate 310 and then the laser oscillator 400 and the reflection mirror 500 may be moved in synchronization with each other, or the laser reflective mask 200' and the substrate 310 may be moved in synchronization with each other. In this case, the patterning is performed while the alignment of the reflective mask 200' and the substrate 310 is fixed, so that the accuracy of the pattern to be formed can be more improved.

Since the reflective mask 200' according to the present invention reflects most of the laser beam emitted in the etching process, the structural damage of the laser reflective mask due to the laser beam may be minimized. Such a characteristic of the laser reflective mask may realize the direct irradiation with the laser beam a relatively higher energy, so that the laser reflective mask 200' can be configured to be positioned adjacent to the substrate 310 without using a separate optical system, i.e., a projection lens or the like, thereby simplifying the configuration of the patterning system.

To prevent the laser beam from being distorted, it is advantageous to form a precise pattern as the laser reflective mask 200' is positioned more closely to the substrate 310. However, if the reflective mask and the substrate come in direct contact with each other or are excessively adjacent to each other, an etching residue produced in the etching process may be attached to the laser reflective mask or the layer to be etched to serve as a defect, so that the etch residue may deteriorate the accuracy of the pattern. Accordingly, it is preferable that the reflective mask and the substrate are disposed to be spaced apart from each other at an appropriate distance.

The laser reflective mask 200' according to the present invention may be used in the form of a multi-mask structure configured by connecting two or more laser reflective masks to a frame. In this case, a reflective layer and a protection layer are formed on the frame in order to prevent the structural damage such as overheat of the frame generated by the energy of the laser beam.

When the patterning is performed over a relatively larger area, the multi-mask structure enables the patterning in the form of one scan without moving the multi-mask structure, so that the processing time may be reduced. Since the multi-mask structure is supported by the frame, a problem such as a drooping phenomenon of the multi-mask can be prevented.

The laser reflective mask and the fabrication method thereof may be used to produce products such as a semiconductor, a liquid crystal display (LCD), a light emitting diode (LED) and a solar cell, to which the thin film technology is applied, so that a more precise pattern may be formed and the configuration of the patterning system may be simplified, thereby reducing the manufacturing cost.

While the present invention has been illustrated and described in connection with the accompanying drawings and the preferred embodiments, the present invention is not limited thereto and is defined by the appended claims. Therefore, it will be understood by those skilled in the art that various modifications and changes can be made thereto without departing from the spirit and scope of the invention defined by the appended claims.

What is claimed is:

1. A fabricating method of a laser reflective mask, the method comprising the steps of:

forming a sacrificial layer on top of a base substrate;

etching an opening through the sacrificial layer and recessing the base substrate by an etching process, for a region prearranged as a reflection region for a laser beam in the base substrate, to form a sacrificial layer pattern and a reflective layer filling groove having a predetermined depth;

alternately and repeatedly laminating first and second reflective layers having different reflectances on top of the base substrate, the sacrificial layer pattern and the reflective layer filling groove formed on the base substrate, until the reflective layer filling groove is completely filled;

removing the sacrificial layer pattern and the first and second reflective layers laminated on top of the sacrificial layer pattern by a laser lift-off process of irradiating the base substrate with the laser beam from a bottom surface of the base substrate, to form a reflective layer pattern configured in the reflective layer filling groove; and removing the sacrificial layer pattern remaining on top of the base substrate.

2. The method of claim 1, wherein the sacrificial layer is formed of a metal layer of one material selected from the group consisting of chrome (Cr) and molybdenum (Mo).

3. The method of claim 1, wherein the sacrificial layer has a laminated structure of at least two different metal layers, including a lowermost first metal layer of chrome or molybdenum, which comes into direct contact with a top surface of the base substrate, and a second metal layer of a material selected from the group consisting of aluminum (Al), copper (Cu), and gold (Au).

4. The method of claim 1, wherein, after the step of removing the sacrificial layer pattern remaining on top of the base substrate, a protection layer, for preventing the laser reflective mask from being damaged by an etchant during a patterning process performed using the laser reflective mask, is additionally formed on the base substrate and the reflective layer pattern.

5. The method of claim 1, wherein the first reflective layer is a $SiO_2$ layer.

6. The method of claim 5, wherein the second reflective layer is selected from the group consisting of a $MgF_2$ layer, a $TiO_2$ layer, an $Al_2O_3$ layer, an $Ta_2O_5$ layer, a cerium fluoride layer, a zinc sulfide layer, an $AlF_3$ layer, a halfnium oxide layer and a zirconium oxide layer.

* * * * *